United States Patent
Hara et al.

(10) Patent No.: US 8,552,820 B2
(45) Date of Patent: Oct. 8, 2013

(54) FILTER, DUPLEXER AND COMMUNICATION MODULE

(75) Inventors: Motoaki Hara, Miyagi (JP); Jun Tsutsumi, Tokyo (JP); Shogo Inoue, Tokyo (JP); Masafumi Iwaki, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/482,103

(22) Filed: May 29, 2012

(65) Prior Publication Data

US 2012/0274421 A1 Nov. 1, 2012

Related U.S. Application Data

(63) Continuation of application No. PCT/JP2010/069658, filed on Nov. 5, 2010.

(30) Foreign Application Priority Data

Nov. 30, 2009 (JP) ................................. 2009-272201

(51) Int. Cl.
*H03H 9/64* (2006.01)
*H03H 9/72* (2006.01)

(52) U.S. Cl.
USPC ............................. 333/195; 333/193; 333/133

(58) Field of Classification Search
USPC .......... 333/193–196, 133; 310/313 B, 313 D
See application file for complete search history.

(56) References Cited

U.S. PATENT DOCUMENTS

| | | | | |
|---|---|---|---|---|
| 6,031,435 A | * | 2/2000 | Inose et al. | 333/193 |
| 6,137,380 A | * | 10/2000 | Ushiroku et al. | 333/193 |
| 6,208,224 B1 | * | 3/2001 | Taniguchi et al. | 333/193 |
| 6,255,916 B1 | | 7/2001 | Nakamura et al. | |
| 6,351,197 B1 | * | 2/2002 | Selmeier et al. | 333/195 |
| 6,480,075 B1 | * | 11/2002 | Fujita et al. | 333/193 |
| 6,570,470 B2 | * | 5/2003 | Maehara et al. | 333/193 |
| 6,819,203 B2 | * | 11/2004 | Taniguchi | 333/193 |
| 7,486,158 B2 | * | 2/2009 | Takata | 333/133 |
| 2003/0062969 A1 | * | 4/2003 | Inoue | 333/193 |
| 2005/0046520 A1 | | 3/2005 | Nishizawa et al. | |
| 2008/0258983 A1 | * | 10/2008 | Bauer et al. | 343/722 |

FOREIGN PATENT DOCUMENTS

| | | |
|---|---|---|
| JP | 60-140918 A | 7/1985 |
| JP | 5-167388 A | 7/1993 |
| JP | 6-338756 A | 12/1994 |
| JP | 10-93375 A | 4/1998 |
| JP | 10-242799 A | 9/1998 |

(Continued)

OTHER PUBLICATIONS

M. Ueda et al.; "Low Loss Ladder Tye SAW Filter in the Range of 300 to 400 MHz"; 1994 IEEE Ultrasonics Symposium, pp. 143-146, 1994.*

(Continued)

*Primary Examiner* — Barbara Summons
(74) *Attorney, Agent, or Firm* — Chen Yoshimura LLP

(57) ABSTRACT

A filter includes at least one series resonator and parallel resonators, the at least one series resonator and the parallel resonators including excitation electrodes and reflectors, the parallel resonators having different resonance frequencies, and at least one of the parallel resonators other than the parallel resonator having the highest resonance frequency being configured to have a pitch of reflectors that is smaller than that of excitation electrodes.

8 Claims, 17 Drawing Sheets

(56) References Cited

FOREIGN PATENT DOCUMENTS

| JP | 2001-308676 | * | 11/2001 |
| JP | 2002-198769 A | | 7/2002 |
| JP | 2003-87096 A | | 3/2003 |
| JP | 2003-249841 A | | 9/2003 |
| JP | 2005-295202 A | | 10/2005 |
| JP | 2005-295203 A | | 10/2005 |

OTHER PUBLICATIONS

International Search Report (ISR) issued in PCT/JP2010/069658 mailed in Feb. 2011.

Written Opinion (PCT/ISA/237) issued in PCT/JP2010/069658 mailed in Feb. 2011.

English translation of Written Opinion (PCT/ISA/237) issued in PCT/JP2010/069658 mailed in Feb. 2011.

* cited by examiner

PASS CHARACTERISTIC IN A CASE WHERE SERIES
AND PARALLEL RESONATORS HAVE AN IDENTICAL
ARRANGEMENT OF ATTENUATION POLES

PASS CHARACTERISTIC IN A CASE
WHERE RESONANCE POINT OF PARALLEL
RESONATOR IS SHIFTED TO A LOWER FREQUENCY

PASS CHARACTERISTIC IN A CASE
WHERE ANTI-RESONANCE FREQUENCY OF SERIES
RESONATOR IS SHIFTED TO A HIGHER FREQUENCY

Duplexer Bank Module

FILTER, DUPLEXER AND COMMUNICATION MODULE

CROSS-REFERENCE TO RELATED APPLICATION

This application is a continuation application of PCT/JP2010/069658 filed Nov. 5, 2010 claiming the benefit of priority of the prior Japanese Patent Application No. 2009-272201, filed on Nov. 30, 2009, the entire contents of which are incorporated herein by reference.

FIELD

A certain aspect of the present invention relates to filters, duplexers and communication modules.

BACKGROUND

There is a rapidly increasing demand for duplexers because of rapid spread of radio communication devices, which are typically portable telephones. Specifically, there is an intense demand for duplexers that have a compact size and a high sharpness and use acoustic wave elements.

Recently, the sophistication of radio communication systems has been developed rapidly, and the required specifications of radio frequency filters have been very complicated. For example, it is preferable that the transmission filter and the reception filter included in the duplexer have low insertion loss in the pass bands, and have high suppression in the other-filter's band (the band of the reception filter with respect to the band of the transmission filter, and the band of the transmission filter with respect to the band of the reception filter).

Generally, the filter mounted in the portable telephone terminals or the like is formed by connecting resonators together over a large number of stages in order to ensure the broad band. For example, exemplary ladder filters are disclosed in Japanese Patent Application Publication Nos. 5-167388 and 10-93375.

However, the above ladder filters have a difficulty in realizing an attenuation pole having a sufficient sharpness.

According to an aspect of the present invention, there is provided a filter having at least one series resonator and parallel resonators, the at least one series resonator and the parallel resonators including excitation electrodes and reflectors, the parallel resonators having different resonance frequencies, and at least one of the parallel resonators other than the parallel resonator having the highest resonance frequency being configured to have a pitch of reflectors that is smaller than that of excitation electrodes.

DETAILED DESCRIPTION

There is a rapidly increasing demand for duplexers because of rapid spread of radio communication devices, which are typically portable telephones. Specifically, there is an intense demand for duplexers that have a compact size and a high sharpness and use acoustic wave elements.

The duplexer includes a transmission filter and a reception filter. These filters may be realized by ladder filters having acoustic wave elements. The ladder filter is an RF filter formed by connecting two resonators having different resonance frequencies in a ladder form.

Figure 1A:
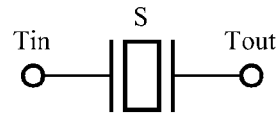
FIG. 1A is a circuit diagram of a configuration in which a resonator S is connected in series to an input terminal Tin and an output terminal Tout.
Figure 1B:
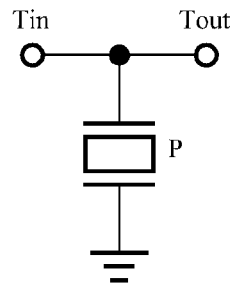
FIG. 1B is a circuit diagram of a configuration in which a resonator P is connected in parallel between an input terminal Tin and an output terminal Tout.
Figure 1C:
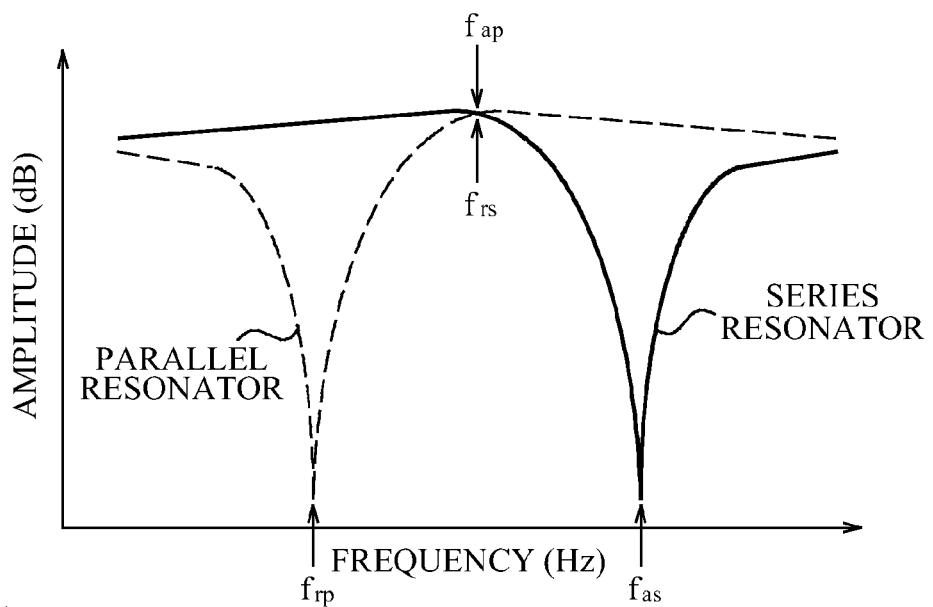
FIG. 1C is a diagram of a frequency characteristic of the resonators S and P.

FIG. 1A is a circuit diagram of a series resonator S. FIG. 1B is a circuit diagram of a parallel resonator P. FIG. 1C is a characteristic diagrams of the pass band of the series resonator S and that of the parallel resonator P. A frequency $f_{rs}$ is the resonance frequency of the series resonator S. A frequency $f_{as}$ is the anti-resonance frequency of the series resonator S. A frequency $f_{rp}$ is the resonance frequency of the parallel resonator P. A frequency $f_{ap}$ is the anti-resonance frequency of the parallel resonator P.

Figure 2A:
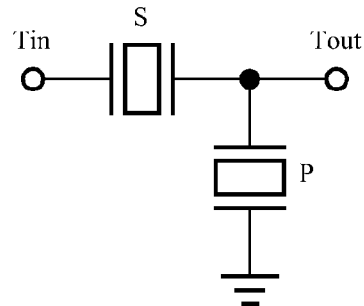
FIG. 2A is a circuit diagram of a configuration in which the resonator S is arranged in a series arm and the resonator P is arranged in a parallel arm.
Figure 2B:
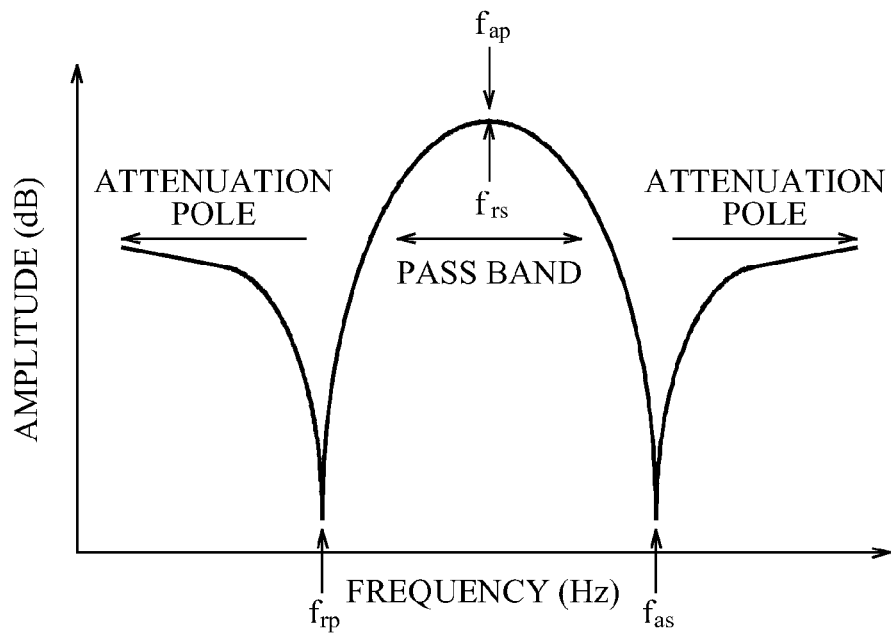
FIG. 2B is a diagram of a frequency characteristic of a filter illustrated in FIG. 2A.

When the anti-resonance frequency $f_{ap}$ of the parallel resonator P and the resonance frequency $f_{rs}$ of the series resonator S are approximately equal to each other, a filter characteristic as illustrated in FIG. 2B is realized by connecting the series resonator S to a series arm and connecting the parallel resonator P to a parallel arm as illustrated in FIG. 2A.

Figure 3A:
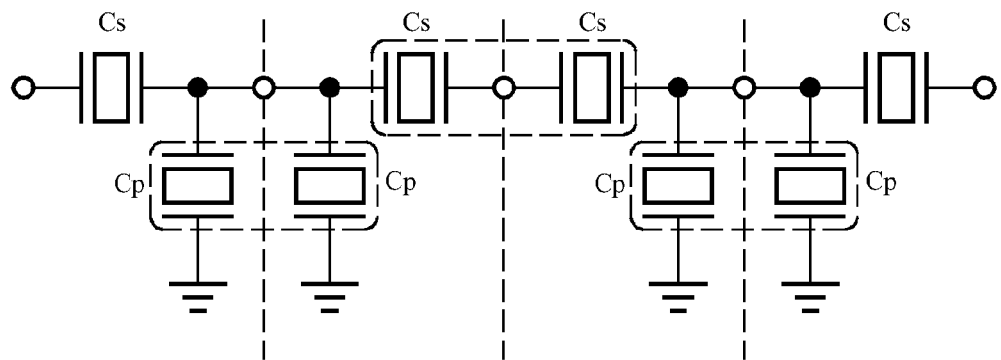
FIG. 3A is a circuit diagram of a ladder filter.
Figure 3B:
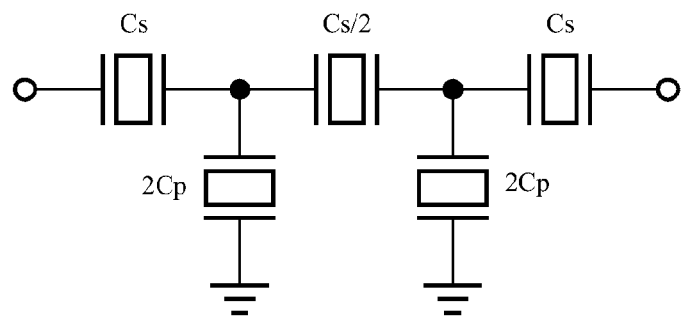
FIG. 3B is a circuit diagram of another ladder filter.

The ladder filter is a circuit formed by connecting a ladder type circuit having a pair of resonators illustrated in FIG. 2A over a plurality of stages. In order to prevent reflection between the stages, each ladder type circuit has a minor inversion configuration, as illustrated in FIG. 3A. More specifically, the series arm of the ladder filter does not alternately have one series resonator and one parallel resonator, but has a correction of one series resonator, one parallel resonator, one parallel resonator and one series resonator in this order, as illustrated in FIG. 3A. In the connection having a plurality of stages as illustrated in FIG. 3A, the series arm has a node at which resonators of the same type are connected in series to each other, and another node at which resonators of the same type are connected in parallel with each other. However, practically, the two resonators of the same type are combined with each other as a single resonator in terms of capacitance for the purpose of downsizing the ladder filter. FIG. 3B depicts a ladder filter in which the resonators surrounded by broken lines are combined with each other in terms of capacitance. In FIG. 3B, the resonators that are connected in the series arm and have a capacitance Cs are combined with each other to have a capacitance of Cs/2. The resonators that are connected in the parallel arms and have a capacitance of Cp are combined with each other to have a capacitance of 2 Cp.

The resonators included in the ladder filter are surface acoustic wave (SAW) resonators in many cases.

Figure 4A:
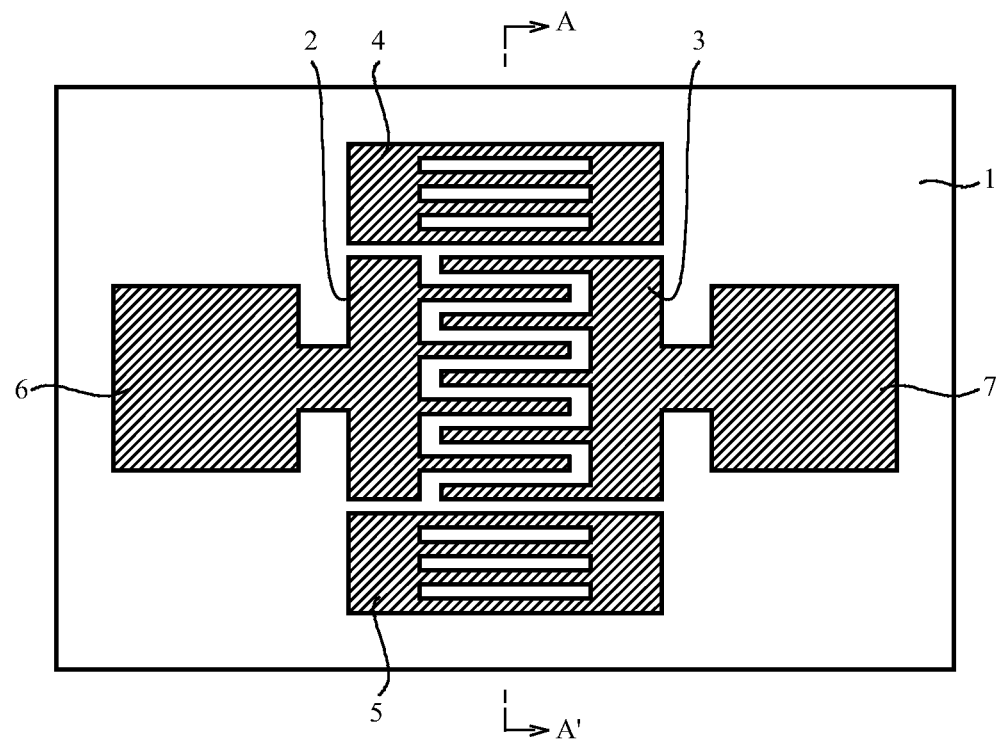
FIG. 4A is a plan view of a surface acoustic wave resonator.
Figure 4B:
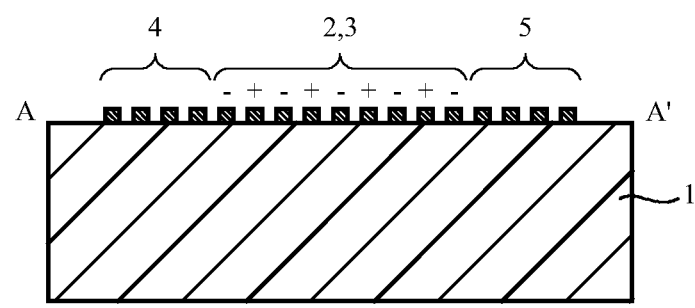
FIG. 4B is a cross-sectional view taken along a line A-A' in FIG. 4A.

FIG. 4A is a plan view of a SAW resonator. FIG. 4B is a cross-sectional view taken along a line A-A' in FIG. 4A. The SAW resonator includes a piezoelectric substrate 1, an interdigital transducer (IDT) composed of a pair of comb-like electrodes 2 and 3, and grating reflectors 4 and 5 provided at both sides of the IDT. The comb-like electrodes 2 and 3 are excitation electrodes. An input terminal 6 is connected to the electrode 2. An output terminal 7 is connected to the electrode 3. In FIG. 4B, symbols "+" indicate fingers of the electrode 2, and symbols "−" indicate fingers of the electrode 3.

Figure 5A:
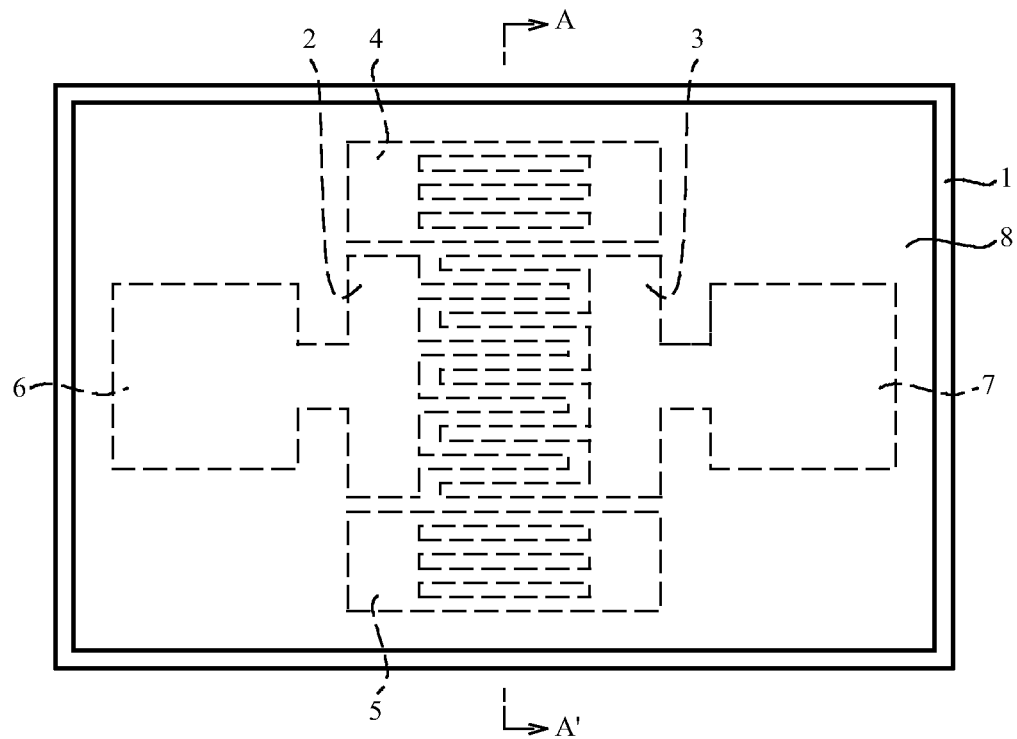
FIG. 5A is a plan view of a boundary acoustic wave.
Figure 5B:
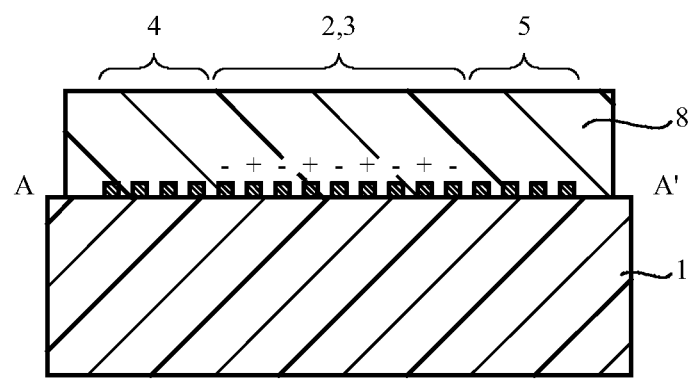
FIG. 5B is a cross-sectional view taken alone a line A-A' in FIG. 5A.
Figure 6A:
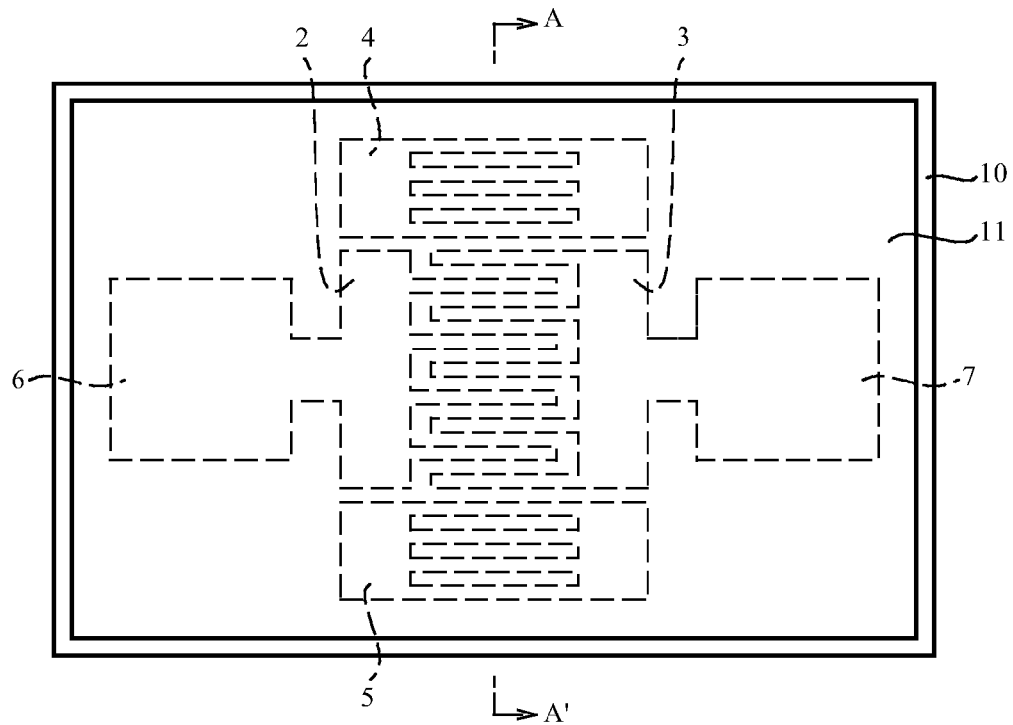
FIG. 6A is a plan view of a Love wave resonator.
Figure 6B:
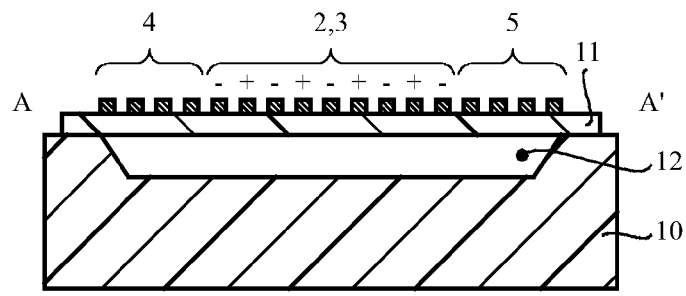
FIG. 6B is a cross-sectional view taken along a line A-A' in FIG. 6A.

FIG. 5A is a plan view of a boundary acoustic wave resonator. FIG. 4B is a cross-sectional view taken along a line A-A' in FIG. 4A. The boundary acoustic wave resonator includes a dielectric film 8, which covers the electrodes 2 and 3 and the reflectors 4 and 5. FIG. 6A is a plan view of a Love wave resonator, and FIG. 6B is a cross-sectional view taken along a line A-A' in FIG. 6A. The Love wave resonator includes a substrate 10, a piezoelectric film 11 formed on the substrate 10, the comb-like electrodes 2 and 3 and the reflectors 4 and 5 formed on the piezoelectric film 11. A cavity 12 is formed in the substrate 10 and is located in an area in which the electrodes 2 and 3 and the reflectors 4 and 5 are arranged two-dimensionally. As described above, the boundary acoustic wave resonator and the Love wave resonator have the electrode structures for excitation of acoustic waves similar to the electrode structure of the SAW resonator, and have electrical characteristics similar to that of the SAW resonator.

The above description suggests that the attenuation poles of the series resonators are arranged similarly and those of the parallel resonators are arranged similarly. However, the attenuation poles of the series resonators may have different arrangements, and those of the parallel resonators may have different arrangements.

Figure 7A:
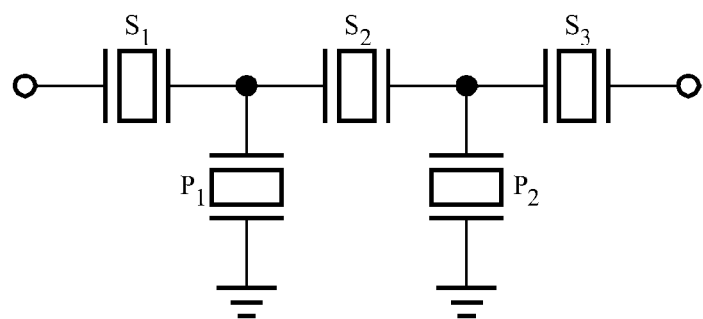
FIG. 7A is a circuit diagram of a ladder filter.
Figure 7B:
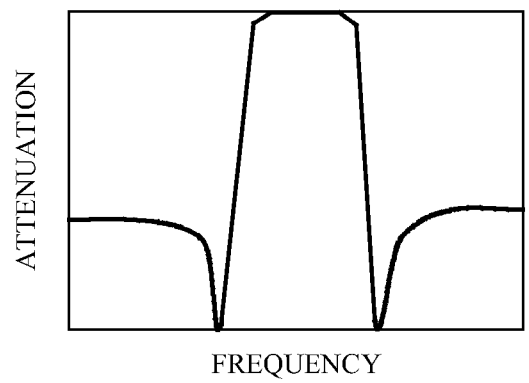
FIG. 7B is a pass characteristic obtained in a configuration in which the series and parallel resonators have an identical arrangement of attenuation poles.

FIGS. 7A through 7E depict resonators having different arrangements of attenuation poles. FIG. 7A is a circuit diagram of a ladder filter. FIG. 7B is a characteristic diagram of the ladder filter configured to have an arrangement in which the attenuation poles of the series resonators S1~S3 are arranged similarly, and those of the parallel resonators P1 and P2 are arranged similarly. As illustrated in FIG. 7B, deep recesses, which are a feature of the ladder filter, are formed at both sides of the pass band.

Figure 7C:
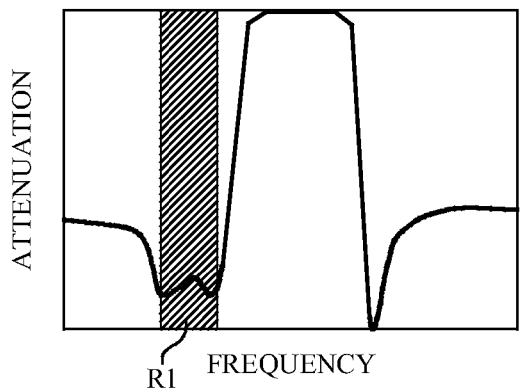
FIG. 7C is a pass characteristic obtained in a configuration in which the resonance point of the parallel resonator is shifted to a lower frequency.

FIG. 7C is a characteristic diagram of the ladder filter configured so that the resonance point of an appropriate parallel resonator is shifted towards the low-frequency side, or is shifted to a lower frequency. By shifting the resonance point of the parallel resonator towards the low-frequency side, two recesses can be formed at the low-frequency side of the pass band of the ladder filter in a range R1 in FIG. 7C. However, the recesses have smaller amounts of attenuation, which may be insufficient in practical use.

Figure 7D:
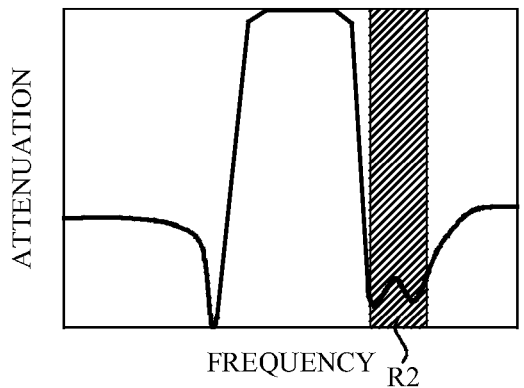
FIG. 7D is a pass characteristic obtained in a configuration in which the anti-resonance point of the series resonator is shifted to a higher frequency.

FIG. 7D is a characteristic diagram of the ladder filter configured so that the anti-resonance point of an appropriate series resonator is shifted towards the high-frequency side, or is shifted to a higher frequency. By shifting the anti-resonance point of the series resonator towards the high-frequency side, two recesses can be formed at the high-frequency side of the pass band of the ladder filter in a range R2 in FIG. 7D. However, the recesses have smaller amounts of attenuation, which may be insufficient in practical use.

As illustrated in FIGS. 7C and 7D, the method of shifting the resonance points of the parallel resonators towards the low-frequency side or shifting the anti-resonance frequencies of the series resonators towards the high-frequency side does not form sharp attenuation poles, but creates an attenuation range having a band in the vicinity of the pass band. Therefore, the method may be applied to a duplexer in which a plurality of filters are combined.

Figure 7E:
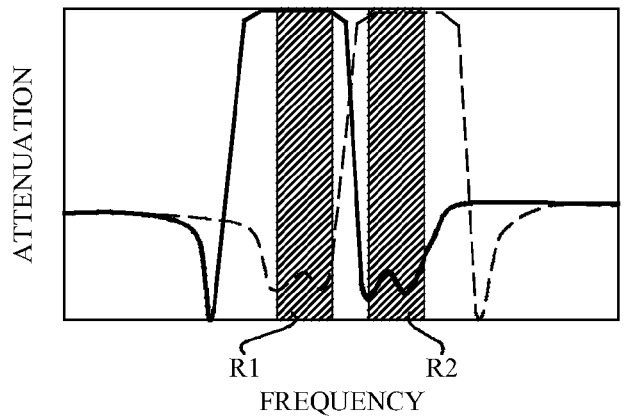
FIG. 7E is a pass characteristic diagram of a duplexer.

FIG. 7E depicts a pass characteristic of a duplexer in which the filter having the pass characteristic depicted in FIG. 7C and that having the pass characteristic in FIG. 7D are combined with each other. In FIG. 7E, a solid line indicates the pass characteristic of the filter depicted in FIG. 7D, and a broken line indicates the pass characteristic of the filter depicted in FIG. 7C.

In the duplexer, the adjustment of the arrangements of the attenuation poles of the resonators included in the filters is an effective means for ensuring the attenuation bands having a sufficient width. However, as has been described previously, the adjustment of the arrangement of the attenuation poles of the resonators reduces the amounts of attenuation of the attenuation poles and degrades the sharpness of the filters. The degradation of the sharpness of the filters may be a serious problem, particularly, in a case where the pass bands of the transmission and reception filters are very close to each other. This problem may occur in a duplexer that handles WCDMA Band 2 (transmission band: 1850~1910 MHz, reception band: 1930~1990 MHz) and WCDMA Band 3 (transmission band: 1710~1785 MHz, reception band: 1805~1880 MHz) where WCDMA is an abbreviation of Wideband Code Division Multiple Access.

According to an aspect of exemplary embodiment of the invention described below, attenuation ranges or bands are ensured in both the transmission and reception filters, and satisfactory sharpness is realized.

First Embodiment

Figure 8:
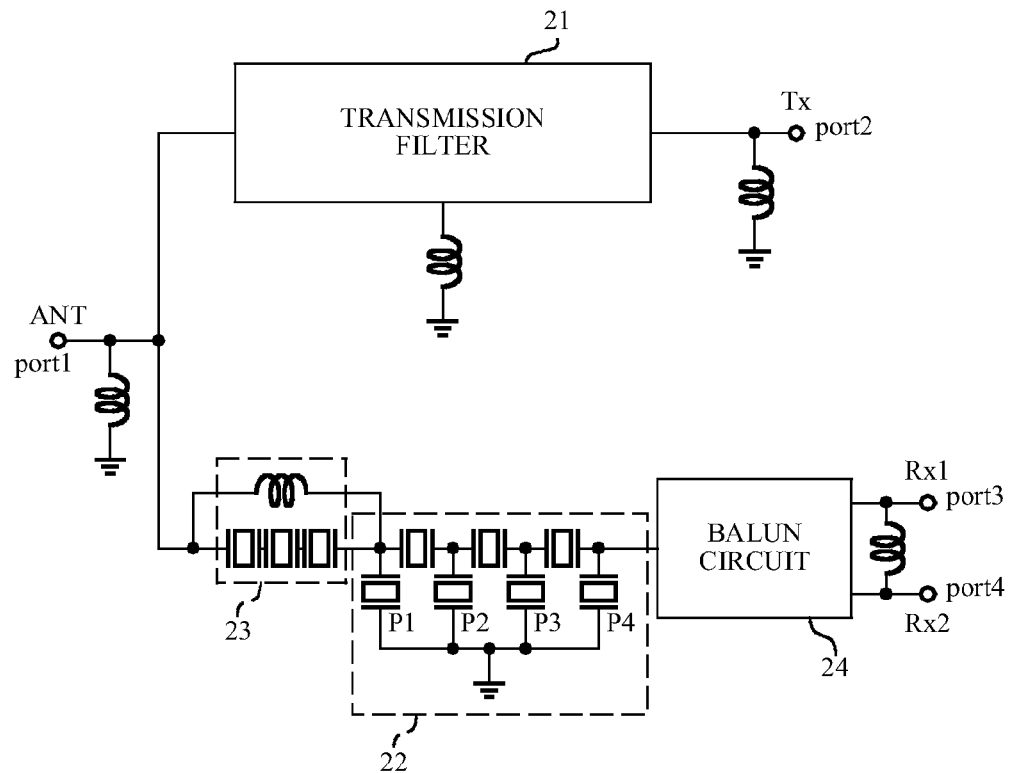
FIG. 8 is a block diagram of a duplexer.

FIG. 8 is a circuit diagram of an exemplary duplexer for the WCDMA Band 2 system. A duplexer depicted in FIG. 8 includes a transmission filter 21, a reception filter 22, a phase shifter 23 and a balun circuit 24. The reception filter 22 is a ladder filter having six stages. The phase shifter 23 has a circuit in which a series circuit of series resonators and an inductor are connected in parallel with each other. The balun circuit 24 converts a single-input system (single input) into two-output systems (balanced outputs). The transmission filter 21 and the phase shifter 23 are connected to an antenna terminal ANT.

Table 1 indicates the resonance frequencies and anti-resonance frequencies of parallel resonators included in the reception filter 22. As indicated in Table 1, the resonance points of the parallel resonators P1 and P2 are located close to the lower-end frequency of the pass band (1930~1990 MHz) of the reception filter 22. The resonance points of the parallel resonators P3 and P4 are located in a frequency band lower in frequency than the pass band. By using the different frequencies of the parallel resonators P1~P4, an attenuation band can be created in the band (1850~1910 MHz) of the reception filter 22.

TABLE 1

| Parallel resonator | P1 | P2 | P3 | P4 |
|---|---|---|---|---|
| Resonance frequency [MHz] | 1911 | 1914 | 1893 | 1901 |
| Anti-resonance frequency [MHz] | 1968 | 1972 | 1959 | 1965 |

Now, a description is given of the relationship between the pitch of the excitation electrodes and that of the reflectors.

Figure 9A:
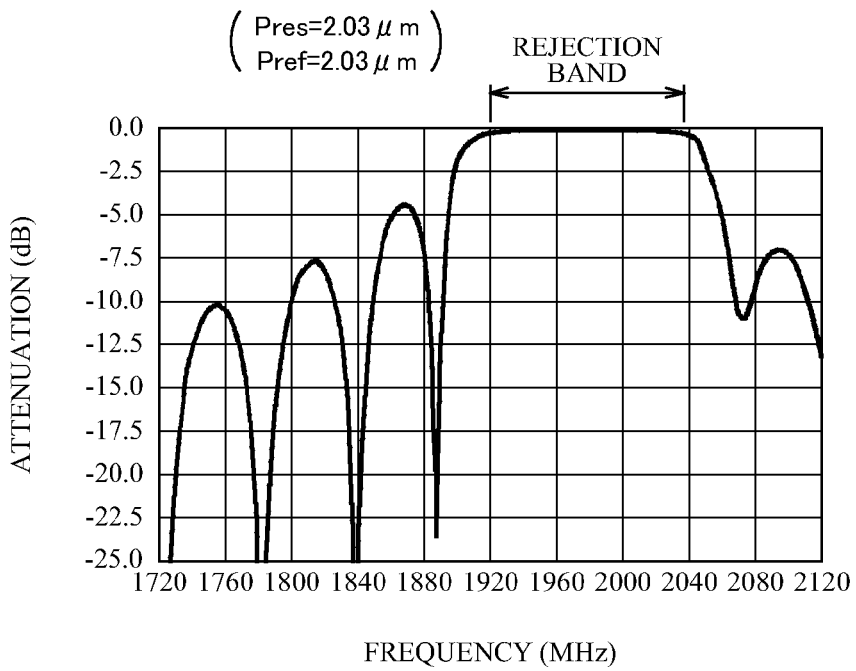
FIG. 9A is a pass characteristic diagram of a resonator.
Figure 9B:
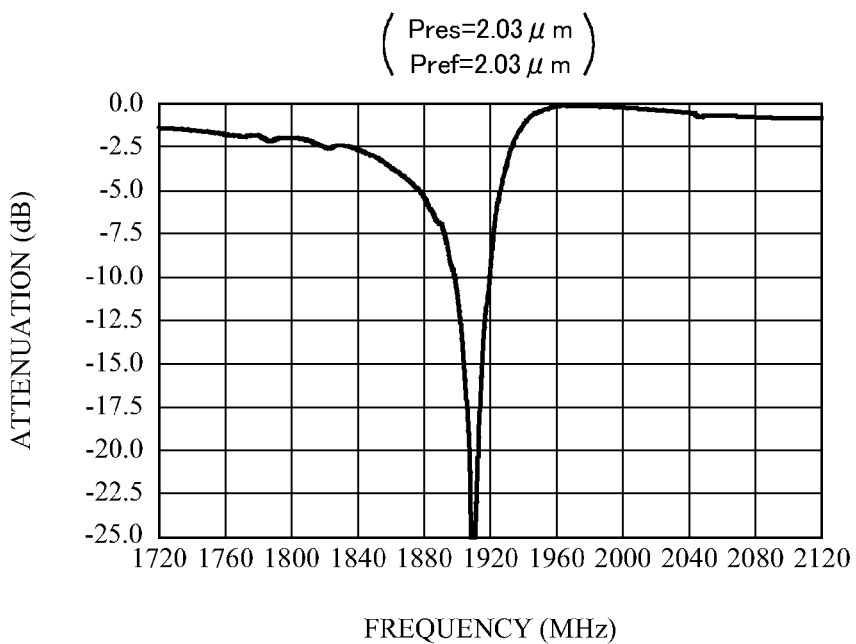
FIG. 9B is a reflection characteristic diagram of a resonator.

FIG. 9A depicts a pass characteristic of a resonator configured so that the pitch $P_{res}$ of the excitation electrodes and the pitch $P_{ref}$ of a resonator are equal to each other. FIG. 9B depicts a reflection characteristic of a reflector configured so that the pitch $P_{res}$ of the excitation electrodes and the pitch $P_{ref}$ of the reflectors are equal to each other. The characteristics of FIGS. 9A and 9B are obtained when the pitch $P_{res}$ of the excitation electrodes and the pitch $P_{ref}$ of the reflectors are set equal to 2.03 µm. In FIG. 9A, a rejection band corresponds to the rejection band of the reflectors that totally reflect waves.

Figure 10A:
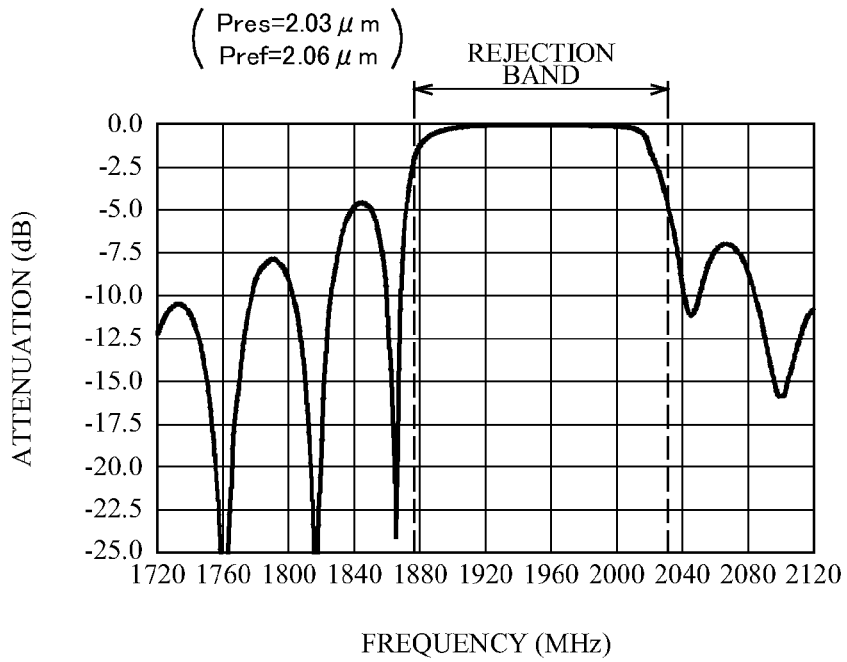
FIG. 10A is a pass characteristic diagram of a resonator.
Figure 10B:
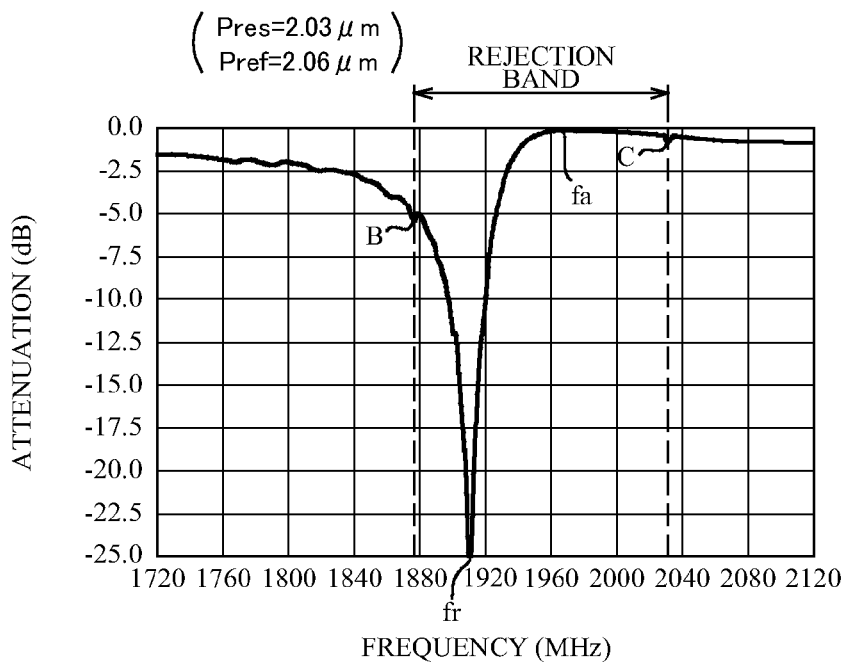
FIG. 10B is a reflection characteristic diagram of a resonator.

FIG. 10A depicts a pass characteristic of a resonator configured so that the pitch $P_{ref}$ of the reflectors is set larger than the pitch $P_{res}$ of P of the excitation electrodes. FIG. 10B depicts a reflection characteristic of the reflectors configured so that the pitch $P_{ref}$ of the reflectors is set larger than the pitch $P_{res}$ of P of the excitation electrodes. The characteristics of FIGS. 10A and 10B are obtained when the pitch $P_{res}$ of the excitation electrodes is set equal to 2.03 µm and the pitch $P_{ref}$ of the reflectors is set equal to 2.06 µm. As illustrated in FIG. 10B, the resonance point $f_r$ and anti-resonance point $f_a$ of the resonator are included in the rejection band of the reflectors. Thus, in order to realize low-insertion-loss filters, it is desired that the pitch of the reflectors is larger than that of the excitation electrodes.

A ripple B generated in the pass characteristic in FIG. 10A is located at the lower-end frequency of the rejection band of the reflectors, and a ripple C is located at the upper-end frequency of the rejection band of the reflectors. The ripples B and C are more conspicuous as the resonator has a smaller capacitance.

Figure 11A:
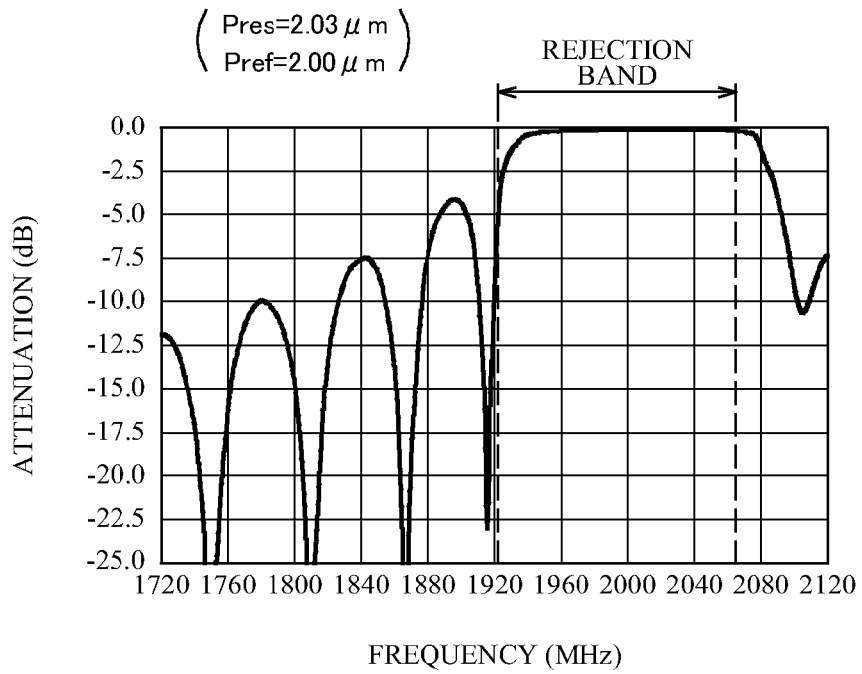
FIG. 11A is a pass characteristic diagram of a resonator.
Figure 11B:
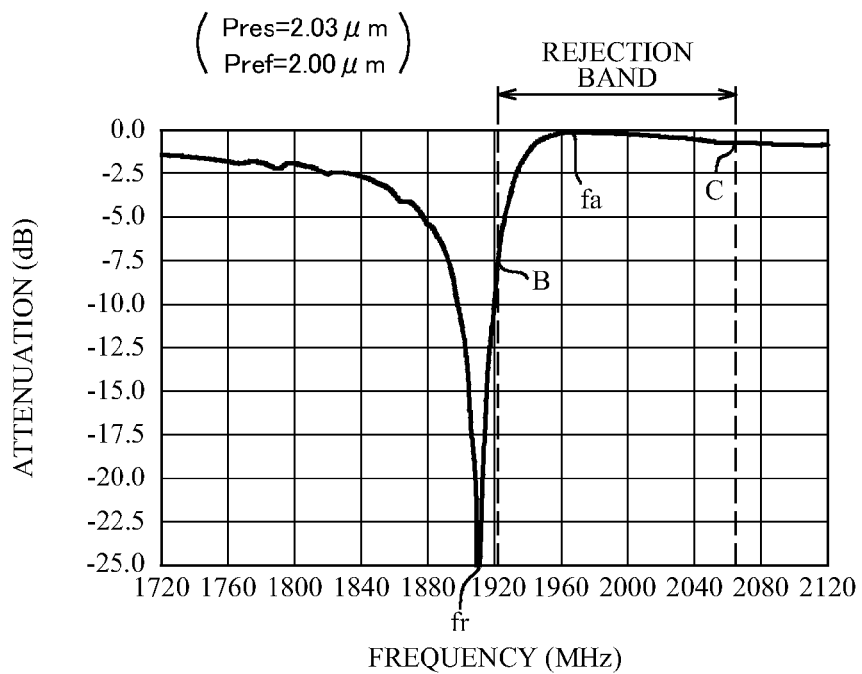
FIG. 11B is a reflection characteristic diagram of a resonator.

FIG. 11A depicts a pass characteristic of a resonator configured so that the pitch $P_{ref}$ of the reflectors is smaller than the pitch $P_{res}$ of the excitation electrodes. FIG. 11B depicts a reflection characteristic of a reflector configured so that the pitch $P_{ref}$ of the reflectors is smaller than the pitch $P_{res}$ of the excitation electrodes. FIGS. 11A and 11B are obtained when the pitch $P_{res}$ of the excitation electrodes is set equal to 2.03 µm and the pitch $P_{ref}$ of the reflectors is set equal to 2.00 µm. By setting the pitch $P_{ref}$ of the reflectors smaller than the pitch $P_{res}$ of the excitation electrodes, as illustrated in FIG. 11B, the ripple B that indicates the end of the rejection band of the reflectors is generated at a frequency higher than the resonance point $f_r$. According to this method, the resonance point $f_r$ is arranged outside of the rejection band of the reflectors, and the loss at the resonance point $f_r$ increases. Therefore, the method is not preferred in filter design. Further, the above method is not preferred because the ripple B is generated between the resonance point $f_r$ and the anti-resonance point $f_a$.

The resonators having the characteristics illustrated in FIGS. 9A~11B suppose that the ratio of the electrode portion and the non-electrode portion (duty ratio) of the reflectors and the that of the excitation electrodes are equal to each other. It is further supposed that the film thickness of the reflectors and that of the excitation electrodes are equal to each other. However, practical devices may be configured so that the reflectors and the excitation electrodes have different duty ratios or different film thicknesses, and it is thus preferable that the discussion based on the electrode pitch should be more essentially given in terms of the magnitude of the leveled pitch. The term "leveled pitch" is defined as a value obtained by dividing the electrode pitch ($P_{res}$, $P_{ref}$) by the acoustic velocity ($V_{ares}$, $V_{aref}$) of the surface acoustic wave propagated through the reflector or the excitation electrode. That is, it can be said that FIGS. 9A and 9B show characteristics observed in a case where the reflectors and the excitation electrodes have an equal leveled pitch. Further, it can be said that FIGS. 10A and 10B show characteristics observed in a case where the leveled pitch of the reflectors is larger than that of the excitation electrodes, and that FIGS. 11A and 11B show characteristics observed in a case where the leveled pitch of the reflectors is smaller than that of the excitation electrodes.

The parallel resonators P3 and P4 described in Table 1 have a characteristic in which the resonance point is located at the low-frequency side of the pass band and away from the pass band. The arrangement of the attenuation poles of the resonators P3 and P4 ensures a certain width of the attenuation band, but reduces the amounts of attenuation of the recesses located close to the ends of the pass band and degrades the sharpness of the filter. With the above in mind, according to an aspect of exemplary embodiments, it is proposed to adjust the reflector pitch of a parallel resonator having a resonance point located at the low-frequency side of the pass band and away from the pass band. Specifically, the reflector pitch of a parallel resonator having a resonance point located at the low-frequency side of the pass band and away therefrom is made smaller than the pitch of the excitation electrodes so that the lower-end frequency of the rejection band of the reflectors coincides with the recess point located at the lower-end frequency of the pass band of the filter.

Figure 12A:
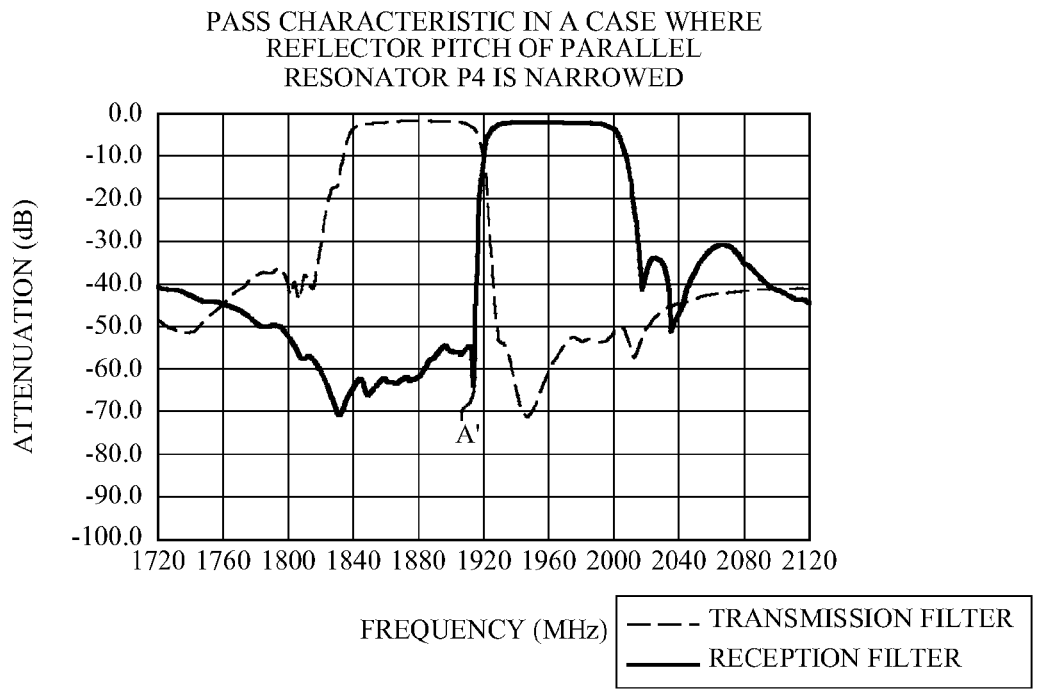
FIG. 12A is a pass characteristic diagram of a parallel resonator in which the reflector pitch is narrowed.
Figure 12B:
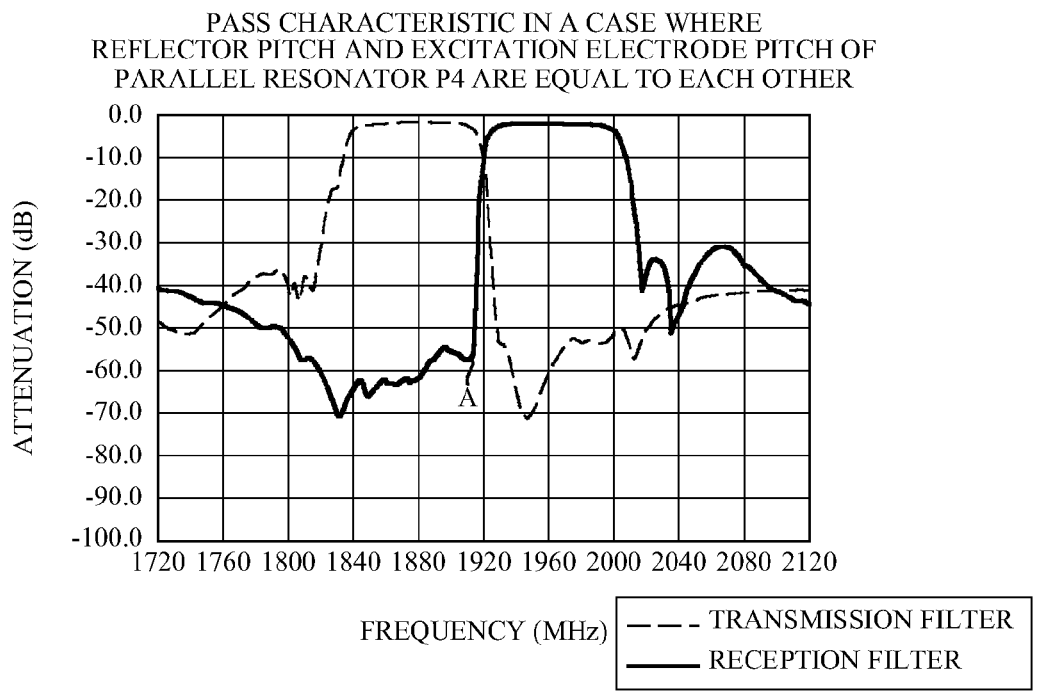
FIG. 12B is a pass characteristic diagram of a parallel resonator in which the reflector pitch and the excitation electrode pitch are equal to each other.

FIG. 12A depicts a pass characteristic obtained when the reflector pitch of the parallel resonator P4 indicated in Table 1 is made smaller as indicated in Table 2 and the lower-end frequency of the rejection band is caused to coincide with the recess at the lower end of the pass band of the filter. FIG. 12B depicts a pass characteristic observed when the reflector pitch of the parallel resonator P4 is equal to the excitation electrode pitch.

TABLE 2

|  | Conventional art | Embodiment |
|---|---|---|
| Excitation electrode pitch [μm] | 2.04 | 2.04 |
| Reflector pitch [μm] | 2.06 | 2.01 |

When the reflector pitch of the parallel resonator P4 is narrowed, the magnitude of recess at a frequency indicated by a reference letter A' in FIG. 12A is increased, and the sharpness close to the lower-end frequency of the pass band is improved. In contrast, when the reflector pitch of the parallel resonator P4 is equal to the excitation electrode pitch thereof, the magnitude of a recess at a frequency indicated by a reference letter A in FIG. 12B is small, and the characteristic close to the lower-end frequency of the pass band is dull, so that a satisfactory sharpness is not available.

Figure 13A:
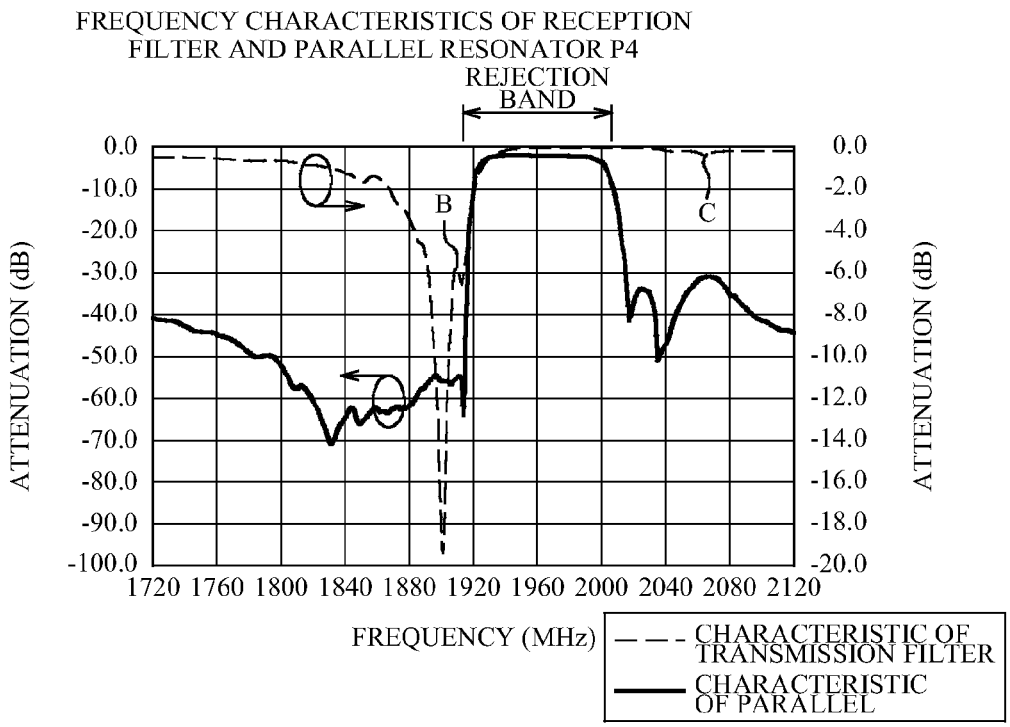
FIG. 13A is a frequency characteristic diagram of a reception filter and a parallel resonator.
Figure 13B:
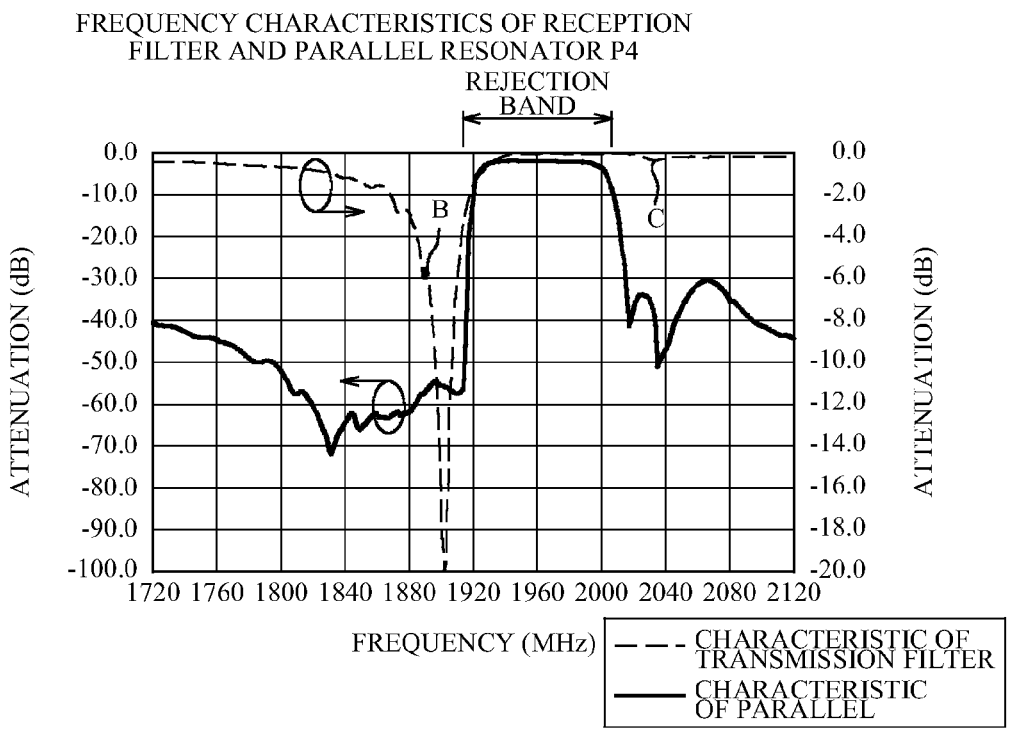
FIG. 13B is a frequency characteristic diagram of a reception filter and a parallel resonator.

FIG. 13A is a characteristic diagram obtained by overlaying the characteristic of the reception filter with the characteristic of the parallel resonator P4 (see FIG. 12A). FIG. 13A is a characteristic diagram obtained by overlaying the characteristic of the reception filter with the characteristic of the parallel resonator P4 illustrated in FIG. 12B. Referring to FIGS. 13A and 13B, spurious components B and C indicate the ends of the rejection band of the reflectors. When the reflector pitch of the parallel resonator P4 is narrowed, as illustrated in FIG. 13A, the lower end of the rejection band of the reflectors is caused to coincide with the recess at the lower end of the pass band of the filter. Therefore, the sharpness at the lower end of the pass band is improved as compared with the characteristic of FIG. 13B.

As described above, when the ripples at the frequencies of the ends of the rejection band of the reflectors are utilized for improvement in sharpness, the positions of the ripples are preferably between the resonance point of the resonator that forms the recess at the lower end of the pass band of the filter and the anti-resonance frequency thereof.

The resonator that determines the recess at the lower end of the pass band of the filter is the specific parallel resonator that has the highest resonance frequency among the parallel resonators included in the filter. In the present embodiment, the resonator that determines the recess at the lower end of the pass band of the filter is the parallel resonator P2.

The ripple generated at the frequency of the lower end of the rejection band of the reflectors may not be used for improvement in sharpness but may be used for improvement in the other-filter band. In this case, the lower-end frequency of the rejection band of the reflectors having a narrowed reflector pitch is preferably located between the resonance point of the parallel resonator P4 and the resonance point of the resonator (P2) having the highest resonance frequency.

According to another aspect of the exemplary embodiment, the sharpness at the upper end of the pass band of the filter may be improved in a similar manner.

Specifically, the reflector pitch of an appropriate series resonator is increased, and the frequency of the upper end of the rejection band of the reflectors is caused to coincide with the recess at the upper end of the pass band of the filter. Thus, effects similar to those illustrated in FIGS. 12A and 12B are obtained at the upper end of the pass band of the filter. The series resonator that defines the recess at the upper end of the pass band of the filter is the resonator that has the lowest anti-resonance frequency among the series resonators included in the filter. Therefore, for the purpose of improving the sharpness, it is preferable that the upper-end frequency of the rejection band of the reflectors shifted by increasing the reflector pitch is preferably positioned between the resonance frequency of the series resonator having the lowest anti-resonance frequency and the anti-resonance frequency thereof.

Supposing that the other-filter band is located at the high-frequency side of the pass band of the filter, the ripples are used to improve the attenuation of the other-filter band, the upper end of the rejection band of the reflectors having the increased reflector pitch is preferably positioned between the anti-resonance frequency of the series resonator and the anti-resonance point of the resonator having the lowest anti-resonance frequency.

Figure 14:
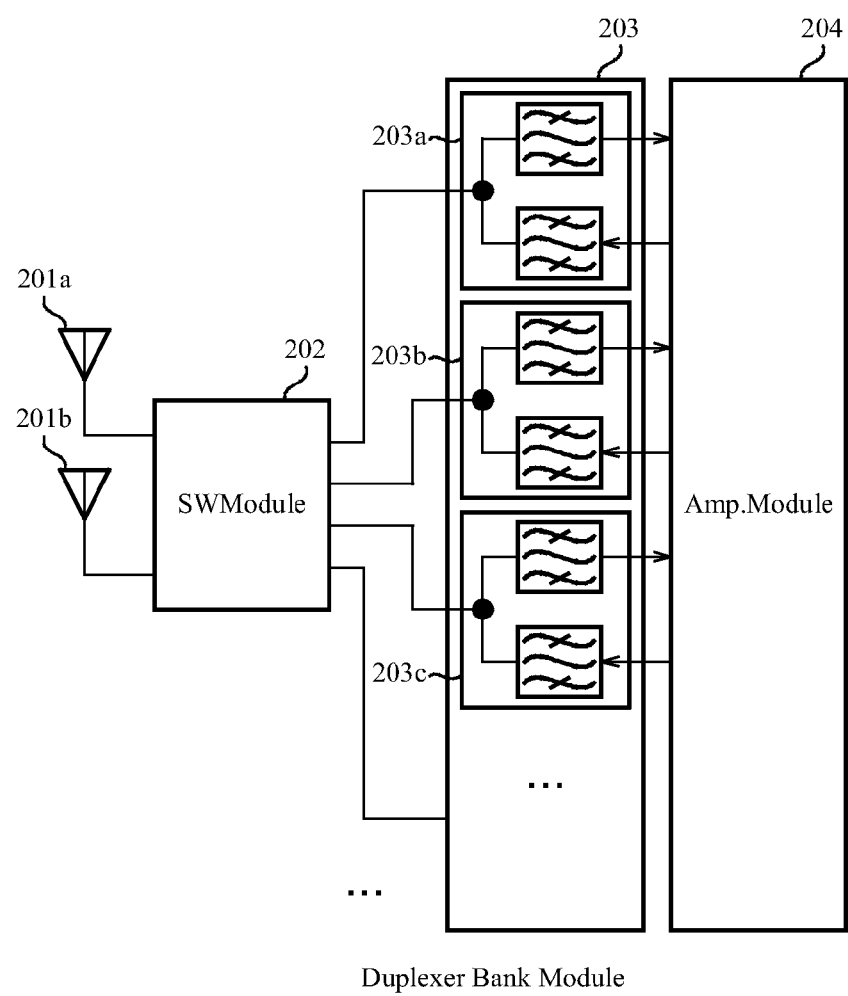
FIG. 14 is a block diagram of a communication module.

FIG. 14 is a block diagram of an exemplary RF module equipped with the duplexer of the present embodiment. An RF module in FIG. 14 includes a switch module (SW) 202, a duplexer bank module 203, and an amplifier module (Amp.) 204. The duplexer bank module 203 has a plurality of duplexers 203a~203c. The switch module 202 is connected to antennas 201a and 201b. The switch module 202 selects one of the duplexers 203a~203c included in the duplexer bank module 203, and allows a transmission signal and a reception signal to pass through the selected duplexer. In FIG. 14, the duplexer is part of the filter bank module 203. This arrangement may be changed so that the duplexer can be formed in a module together with the amplifier module 204 or the switch module 202.

Figure 15:
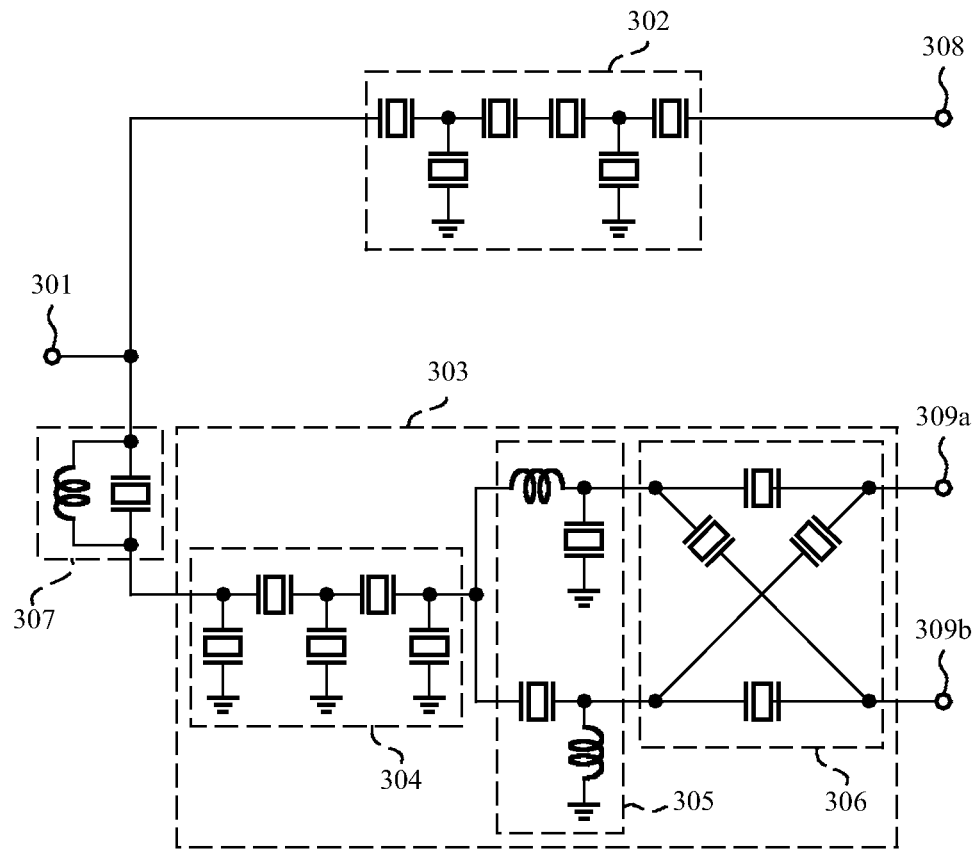
FIG. 15 is a circuit diagram of a concrete configuration of a duplexer.

FIG. 15 is a circuit diagram of a duplexer in accordance with a second embodiment. The duplexer includes an antenna terminal 301, a transmission filter 302, a reception filter 303, a matching circuit 307, a transmission terminal 308, and reception terminals 309a and 309b. The antenna terminal 301 is connected to an antenna. The transmission filter 302 is realized by a ladder filter. The reception filer 303 includes a ladder filter 304, a lumped constant type balun circuit 305, and a lattice filter 306. The ladder filter 304 has resonators configured under the conditions of the embodiment. The lumped constant type balun circuit 305 performs a single-balance conversion for connecting the output terminal (single terminal) of the ladder filter 304 to the input terminals (balanced terminals) of the lattice filter 306.

Figure 16A:
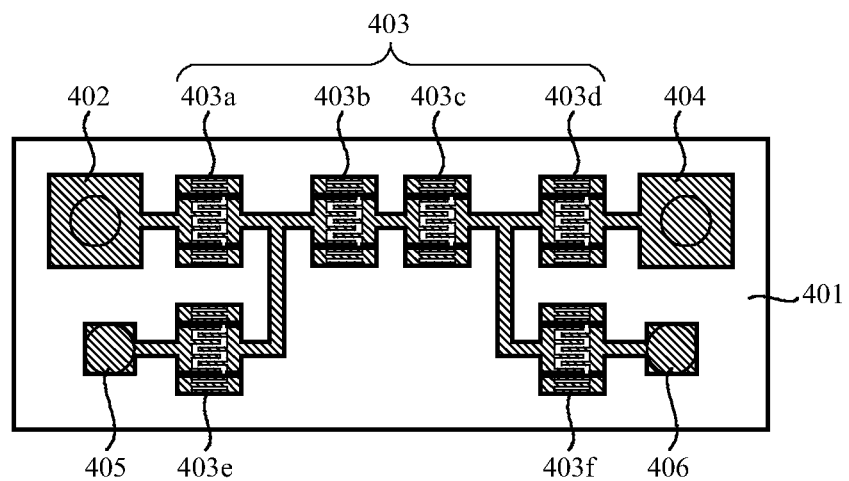
FIG. 16A is a plan view of an exemplary transmission filter.

FIG. 16A is a schematic view of an exemplary filter chip of a transmission filter of a duplexer in accordance with an embodiment. A filter chip has a 42° Y-cut LiNbO$_3$ substrate 401 on which Al electrodes patterned into a comb shape are formed. On the substrate 401, there are provided an input terminal 402 connected to an antenna terminal, a ladder filter 403, an output terminal 404 connected to a transmission terminal, and ground terminals 405 and 406. The ladder filter 403 includes series resonators 403a~403d and parallel resonators 403e and 403f.

Figure 16B:
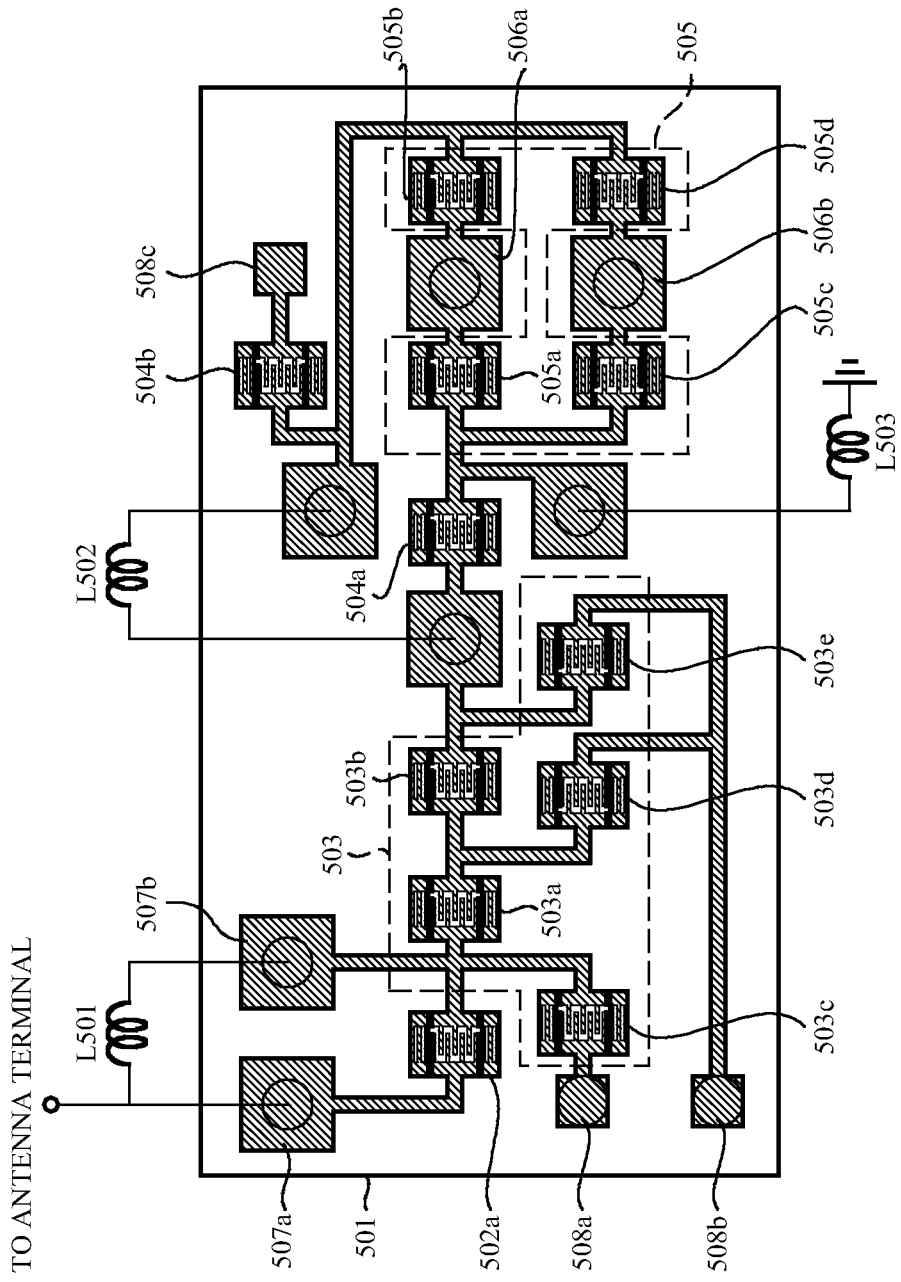
FIG. 16B is a plan view of an exemplary reception filter.

FIG. 16B is a schematic view of an exemplary filter chip of a reception filter included in the duplexer in accordance with the embodiment. A filter chip is a 42° Y-cut LiNbO$_3$ substrate 401 on which Al electrodes patterned into a comb shape are formed. On the substrate 501, there are provided a resonator 502a for a matching circuit, a ladder filter 503, resonators 504a and 504b for a lumped-constant type balun, a lattice filter 505, output terminals 506a and 506b, bumps 507a and 507b, and ground terminals 508a~508c. The matching circuit includes the resonator 502a and an inductor L501. The ladder filter 503 includes series resonators 503a and 503b, and parallel resonators 503c~503e. The lumped-constant type balun includes resonators 504a and 504b functioning as capacitors, and inductors L502 and L503. The lattice filter 505 includes resonators 505a~505d. The bumps 507a and 507b are connected to an antenna terminal (not illustrated).

Although the transmission filter and the reception filters have separate chips in FIGS. 16A and 16B, these filters may be formed on a single substrate.

Figure 17:
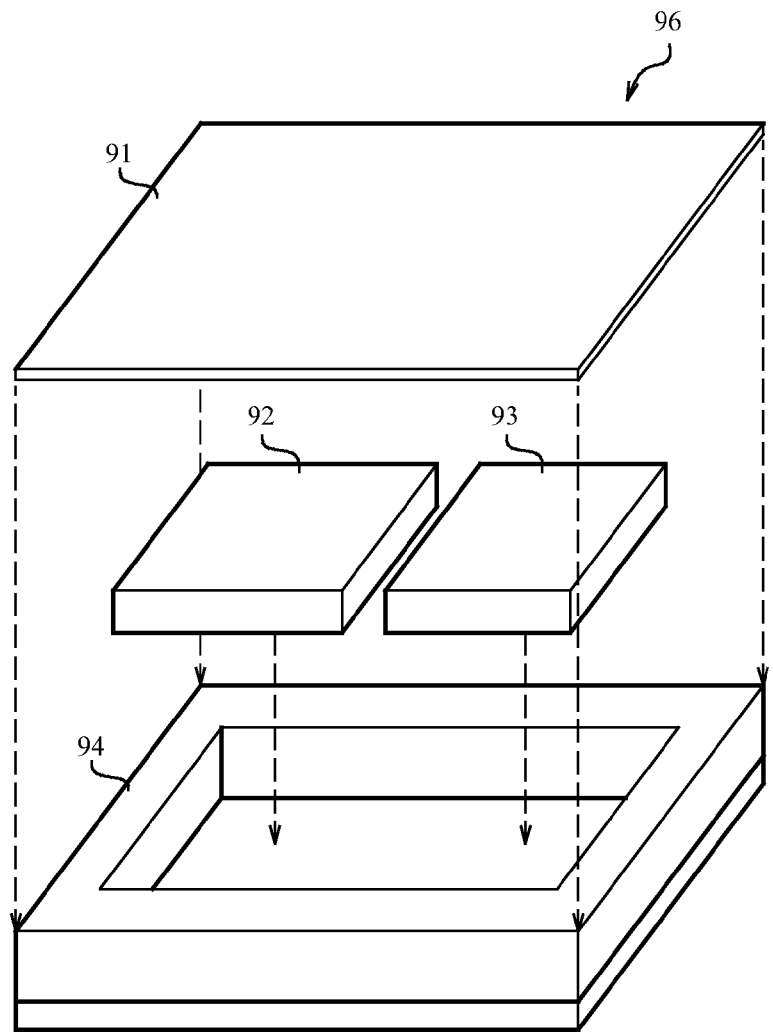
FIG. 17 is a perspective view of an exemplary duplexer.
Figure 18:
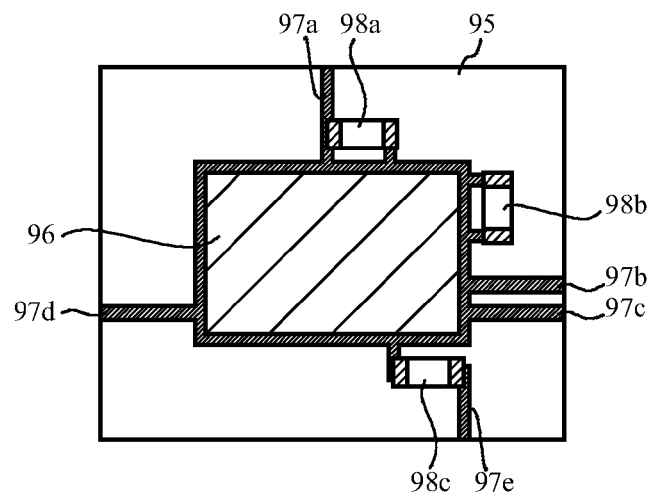
FIG. 18 is a plan view of an example of mounting a duplexer.

FIGS. 17 and 18 are schematic views of a way to mount the duplexer. It is desirable that the filter chips are hermetically sealed because the filter chips have portions mechanically driven. An exemplary hermetical seal may be realized by welding a plate-shaped metal lid to a ceramic package having cavities.

FIG. 17 is an exploded perspective view of the filter chips of the duplexer. As illustrated in FIG. 17, a reception filter chip 92 and a transmission filter chip 93 are placed in cavities of a ceramic package 94, which is hermetically sealed with a metal lid 91.

FIG. 18 is a plan view of an exemplary method of mounting the duplexer package 96. Referring to FIG. 18, on a substrate 95, there are mounted the duplexer package 96, an inductor chip 98a for a matching circuit, and inductor chips 98b and 98c for lumped-constant type balun circuit. Further, on the substrate 95, there are provided electrically conductive patterns 97a~97e used to connect the duplexer package 96, the inductor chips 98a~98c to each other or the outside of the substrate 95. The conductive pattern 97a is connected to the antenna. The conductive patterns 97b and 97c are connected to a reception circuit. The conductive pattern 97d is connected to a transmission circuit. The conductive pattern 97e is connected to ground.

The present embodiment needs an inductance for impedance matching with the balun or antenna, and such an inductance may be implemented by an inductor chip integrated on a module board, as illustrated in FIG. 18.

Figure 19:
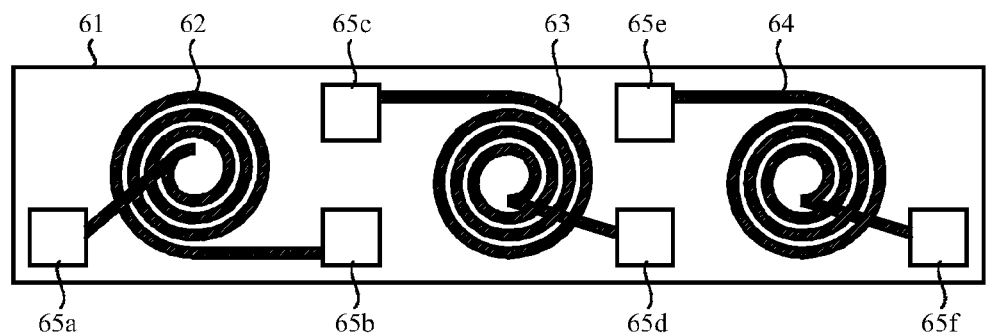
FIG. 19 is a schematic view of an exemplary IPD.

The method for integrating the inductance uses the chip inductor in FIG. 18. However, the inductance is not limited to the chip component but may be implemented by IPD (Integrated Passive Device) formed on a substrate as illustrated in FIG. 19. An IPD illustrated in FIG. 19 has a substrate 61 on which mounted are a inductor 62 for a matching circuit, inductors 63 and 64 for a lumped-constant type balun, and pads 65a~65f. The inductors 62~64 are spiral coils. The pads 65a and 65b are respectively connected to the ends of the inductor 72. The pads 65c and 65d are respectively connected to the ends of the inductor 63. The pads 65e and 65f are respectively connected to the ends of the inductor 64.

Figure 20:
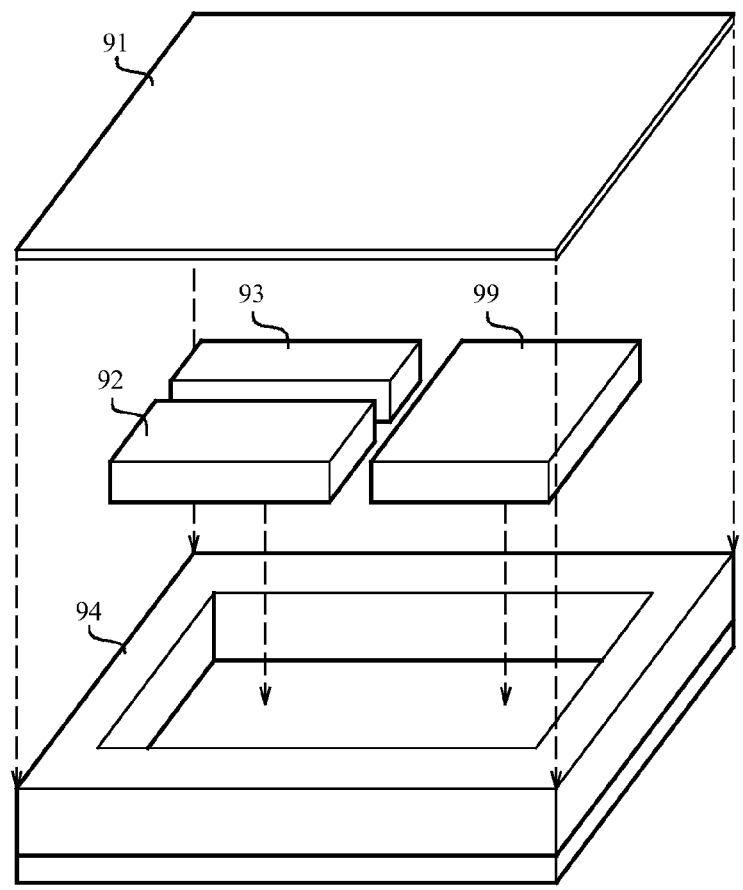
FIG. 20 is a perspective view of an exemplary duplexer with an IPD.

The IPD is desirably housed in the package in order to ensure the mechanical strength. As illustrated in FIG. 20, it is desirable that the IPD is hermetically sealed along with the filter chips. FIG. 20 is an exploded perspective view of filter chips of the duplexer. Referring to FIG. 20, the ceramic package 94 has a cavity in which the reception filter chip 92, the transmission filter chip 93 and the IPD 99 are accommodated and are hermetically sealed with the metal lid 91.

According to an aspect of the embodiment, there is provided a ladder filter formed by connecting at least one series resonator and parallel resonators in a ladder form, the parallel resonators having different resonance frequencies. At least one of the parallel resonators other than the parallel resonator having the highest resonance frequency is configured to have the pitch of reflectors that is smaller than that of excitation electrodes so that the lower-end frequency of the rejection band of the reflectors is made close to the pass band of the filter. Thus, in both the transmission and reception filters, the attenuation bands are ensured and a high sharpness is realized.

According to another aspect of the embodiment, there is provided a ladder filter formed by connecting at least one series resonator and parallel resonators in a ladder form, the parallel resonators having different resonance frequencies. At least one of the parallel resonators other than the parallel resonator having the highest resonance frequency is configured so that the ratio ($P_{ref}/V_{aref}$) of the pitch $P_{ref}$ of the reflectors to the velocity $V_{aref}$ of the acoustic wave propagated through the reflectors is made smaller than the ratio ($P_{res}/V_{ares}$) of the pitch $P_{res}$ of the excitation electrodes to the velocity $V_{ares}$ of the acoustic wave propagated through the excitation electrodes. Thus, in both the transmission and reception filters, the attenuation bands are ensured and a high sharpness is realized.

According to yet another aspect of the embodiment, there is a provided a filter in which series resonators have different anti-resonance frequencies. At least one of the series resonators other than the series resonator having the lowest anti-resonance frequency is configured to have the pitch of reflectors that is larger than that of excitation electrodes. Thus, in both the transmission and reception filters, the attenuation bands are ensured and a high sharpness is realized.

According to a further aspect of the embodiment, there is provided a filter in which series resonators have different anti-resonance frequencies. At least one of the series resonators other than the series resonator having the lowest anti-resonance frequency is configured so that the ratio ($P_{ref}/V_{aref}$) of the pitch $P_{ref}$ of the reflectors to the velocity $V_{aref}$ of the acoustic wave propagated through the reflectors is made larger than the ratio ($P_{res}/V_{ares}$) of the pitch $P_{res}$ of the excitation electrodes to the velocity $V_{ares}$ of the acoustic wave propagated through the excitation electrodes. Thus, in both the transmission and reception filters, the attenuation bands are ensured and a high sharpness is realized.

Some aspects of the embodiments are described below.

(Item 1) A filter having at least one series resonator and parallel resonators, the at least one series resonator and the parallel resonators including excitation electrodes and reflectors, the parallel resonators having different resonance frequencies, and at least one of the parallel resonators other than the parallel resonator having the highest resonance frequency being configured to have a pitch of reflectors that is smaller than that of excitation electrodes.

(Item 2) A filter having at least one series resonator and parallel resonators, the at least one series resonator and the parallel resonators including excitation electrodes and reflectors, the parallel resonators having different resonance frequencies, and at least one of the parallel resonators other than the parallel resonator having the highest resonance frequency being configured so that a ratio ($P_{ref}/V_{aref}$) of a pitch $P_{ref}$ of the reflectors to a velocity $V_{aref}$ of an acoustic wave propagated through the reflectors is smaller than a ratio ($P_{res}/V_{ares}$) of a pitch $P_{res}$ of the excitation electrodes to a velocity $V_{ares}$ of an acoustic wave propagated through the excitation electrodes.

(Item 3) The filter according to Item 1 or 2, wherein in at least one of the parallel resonators configured so that the pitch of the reflectors is smaller than that of the excitation electrodes or the ratio ($P_{ref}/V_{aref}$) is smaller than the ratio ($P_{res}/V_{ares}$) lower-end frequency of a rejection band of a reflector of the at least one of the parallel resonators is arranged between a resonance point of the at least one of the parallel resonators and an anti-resonance point of the parallel resonator having the highest resonance frequency.

(Item 4) The filter according to Item 1 or 2, wherein at least one of the parallel resonators configured so that the pitch of the reflectors is smaller than that of the excitation electrodes or the ratio ($P_{ref}/V_{aref}$) is smaller than the ratio ($P_{res}/V_{ares}$) has a smallest electrostatic capacitance among the parallel resonators.

(Item 5) A filter having series resonators and at least one parallel resonator, the series resonators and the at least one parallel resonator including excitation electrodes and reflectors, the series resonators having different anti-resonance frequencies, and at least one of the series resonators other than the series resonator having the lowest anti-resonance frequency being configured to have a pitch of the reflectors larger than that of the excitation electrodes.

(Item 6) A filter having series resonators and at least one parallel resonator, the series resonators and the at least one parallel resonator including excitation electrodes and reflectors, the series resonators having different anti-resonance frequencies, and at least one of the series resonators other than the series resonator having the lowest anti-resonance frequency being configured so that a ratio ($P_{ref}/V_{aref}$) of a pitch $P_{ref}$ of the reflectors to a velocity $V_{aref}$ of an acoustic wave propagated through the reflectors is larger than a ratio ($P_{res}/V_{ares}$) of a pitch $P_{res}$ of the excitation electrodes to a velocity $V_{ares}$ of an acoustic wave propagated through the excitation electrodes.

(Item 7) The filter according to Item 5 or 6, wherein in at least one of the series resonators configured so that the pitch of the reflectors is larger than that of the excitation electrodes or the ratio ($P_{ref}/V_{aref}$) is larger than the ratio ($P_{res}/V_{ares}$) an upper-end frequency of a rejection band of a reflector of the at least one of the series resonators is arranged between an anti-resonance point of the at least one of the series resonators and an anti-resonance point of the series resonator having the lowest anti-resonance frequency.

(Item 8) The filter according to Item 5 or 6, wherein at least one of the series resonators configured so that the pitch of the reflectors is larger than that of the excitation electrodes or the ratio ($P_{ref}/V_{aref}$) is larger than the ratio ($P_{res}/V_{ares}$) has a smallest electrostatic capacitance among the series resonators.

(Item 9) A duplexer comprising a transmission filter and a reception filter, one of the transmission filter and the reception filter being configured according to any one of Items 1~8.

(Item 10) A communication module configured to have a filter that is one of Items 1~8 or a duplexer of Item 9.

What is claimed is:

1. A filter having at least one series resonator and parallel resonators,
    the at least one series resonator and the parallel resonators including excitation electrodes and reflectors,
    the parallel resonators having different resonance frequencies, and
    at least one of the parallel resonators other than the parallel resonator having the highest resonance frequency being configured to have a pitch of reflectors that is smaller than that of excitation electrodes,
    wherein in at least one of the parallel resonators configured so that the pitch of the reflectors is smaller than that of the excitation electrodes, a lower-end frequency of a rejection band of a reflector of said at least one of the parallel resonators is arranged between a resonance point of said at least one of the parallel resonators and an anti-resonance point of the parallel resonator having the highest resonance frequency.

2. The filter according to claim 1, wherein at least one of the parallel resonators configured so that the pitch of the reflectors is smaller than that of the excitation electrodes has a smallest electrostatic capacitance among the parallel resonators.

3. A filter having at least one series resonator and parallel resonators,
    the at least one series resonator and the parallel resonators including excitation electrodes and reflectors,
    the parallel resonators having different resonance frequencies, and
    at least one of the parallel resonators other than the parallel resonator having the highest resonance frequency being configured so that a ratio ($P_{ref}/V_{aref}$) of a pitch $P_{ref}$ of the reflectors to a velocity $V_{aref}$ of an acoustic wave propagated through the reflectors is smaller than a ratio ($P_{res}/V_{ares}$) of a pitch $P_{res}$ of the excitation electrodes to a velocity $V_{ares}$ of an acoustic wave propagated through the excitation electrodes,
    wherein in at least one of the parallel resonators configured so that the ratio ($P_{ref}/V_{aref}$) is smaller than the ratio ($P_{res}/V_{ares}$), a lower-end frequency of a rejection band of a reflector of said at least one of the parallel resonators is arranged between a resonance point of said at least one of the parallel resonators and an anti-resonance point of the parallel resonator having the highest resonance frequency.

4. The filter according to claim 3, wherein at least one of the parallel resonators configured so that the ratio ($P_{ref}/V_{aref}$) is smaller than the ratio ($P_{res}/V_{ares}$) has a smallest electrostatic capacitance among the parallel resonators.

5. A filter having series resonators and at least one parallel resonator,
    the series resonators and the at least one parallel resonator including excitation electrodes and reflectors,
    the series resonators having different anti-resonance frequencies, and
    at least one of the series resonators other than the series resonator having the lowest anti-resonance frequency being configured to have a pitch of the reflectors larger than that of the excitation electrodes,
    wherein in at least one of the series resonators configured so that the pitch of the reflectors is larger than that of the excitation electrodes, an upper-end frequency of a rejection band of a reflector of said at least one of the series resonators is arranged between an anti-resonance point of said at least one of the series resonators and a resonance point of the series resonator having the lowest anti-resonance frequency.

6. The filter according to claim 5, wherein at least one of the series resonators configured so that the pitch of the reflectors is larger than that of the excitation electrodes has a smallest electrostatic capacitance among the series resonators.

7. A filter having series resonators and at least one parallel resonator,
    the series resonators and the at least one parallel resonator including excitation electrodes and reflectors,
    the series resonators having different anti-resonance frequencies, and
    at least one of the series resonators other than the series resonator having the lowest anti-resonance frequency being configured so that a ratio ($P_{ref}/V_{aref}$) of a pitch $P_{ref}$ of the reflectors to a velocity $V_{aref}$ of an acoustic wave propagated through the reflectors is larger than a ratio ($P_{res}/V_{ares}$) of a pitch $P_{res}$ of the excitation electrodes to a velocity $V_{ares}$ of an acoustic wave propagated through the excitation electrodes, wherein in at least one of the series resonators configured so that the ratio ($P_{ref}/V_{aref}$) is larger than the ratio ($P_{res}/V_{ares}$), an upper-end frequency of a rejection band of a reflector of said at least one of the series resonators is arranged between an anti-resonance point of said at least one of the series resonators and a resonance point of the series resonator having the lowest anti-resonance frequency.

8. The filter according to claim 7, wherein at least one of the series resonators configured so that the ratio ($P_{ref}/V_{aref}$) is larger than the ratio ($P_{res}/V_{ares}$) has a smallest electrostatic capacitance among the series resonators.

* * * * *